(12) United States Patent
Heller et al.

(10) Patent No.: US 12,669,540 B2
(45) Date of Patent: Jun. 30, 2026

(54) PHASE-SHIFTER FUNCTIONAL SAFETY TESTING

(71) Applicant: AyDeeKay LLC, Aliso Viejo, CA (US)

(72) Inventors: Tom Heller, Aliso Viejo, CA (US); Danny Elad, Aliso Viejo, CA (US); Benny Sheinman, Aliso Viejo, CA (US); Oded Katz, Aliso Viejo, CA (US)

(73) Assignee: AyDeeKay LLC, Aliso Viejo, CA (US)

( * ) Notice: Subject to any disclaimer, the term of this patent is extended or adjusted under 35 U.S.C. 154(b) by 198 days.

(21) Appl. No.: 18/520,536

(22) Filed: Nov. 27, 2023

(65) Prior Publication Data

US 2024/0175918 A1 May 30, 2024

Related U.S. Application Data

(60) Provisional application No. 63/428,424, filed on Nov. 29, 2022.

(51) Int. Cl.
*G01R 31/3167* (2006.01)
*G01S 13/931* (2020.01)

(52) U.S. Cl.
CPC ........ *G01R 31/3167* (2013.01); *G01S 13/931* (2013.01)

(58) Field of Classification Search
CPC .......................... G01S 13/931; G01R 31/3167
See application file for complete search history.

(56) References Cited

U.S. PATENT DOCUMENTS

| | | | |
|---|---|---|---|
| 5,751,249 A * | 5/1998 | Baltus | H04B 1/30 |
| | | | 342/372 |
| 5,809,040 A * | 9/1998 | Dallmann | G11C 29/38 |
| | | | 365/201 |
| 6,104,304 A * | 8/2000 | Clark | G06F 11/2221 |
| | | | 455/67.14 |
| 2018/0329027 A1 | 11/2018 | Eshraghi et al. | |
| 2019/0115989 A1 | 4/2019 | Rodriguez-Herrera et al. | |
| 2020/0150256 A1 | 5/2020 | Dent et al. | |
| 2022/0003839 A1 * | 1/2022 | Heller | G01S 7/4008 |
| 2022/0006432 A1 | 1/2022 | Heller et al. | |

OTHER PUBLICATIONS

PCT Patent Appl. Serial No. PCT/US23/081223, International Search Report and Written Opinion, Apr. 1, 2024.

* cited by examiner

*Primary Examiner* — Noam Reisner
(74) *Attorney, Agent, or Firm* — Steven Stupp

(57) ABSTRACT

An integrated circuit that performs testing of a circuit sub-block is described. This integrated circuit may include the circuit sub-block that performs a function, where the circuit sub-block is implemented in an analog domain using analog components and in a digital domain using digital components. Moreover, the integrated circuit may perform the testing of the circuit sub-block using independent testing of individual components in the circuit sub-block instead of testing the function of the circuit sub-block as a whole. Note that the individual components include the analog components and the digital components. In some embodiments, the testing may include functional safety testing.

20 Claims, 10 Drawing Sheets

CB (CG) BIAS: 144 COMPONENTS (12%)

VGA CB (CG) (1.1%)

CE (CS) BIAS (3.4%)

LUT DECODER: 994 COMPONENTS (82%)

REPLICA A                REPLICA B

─1000

PERFORM TESTING OF A CIRCUIT SUB-
BLOCK
1010

ASSESS THE CIRCUIT SUB-BLOCK
1012

PHASE-SHIFTER FUNCTIONAL SAFETY TESTING

CROSS REFERENCE TO RELATED APPLICATIONS

This application claims priority under 35 U.S.C. 119(e) to U.S. Provisional Application Ser. No. 63/428,424, entitled "Phase-Shifter Functional Safety Testing," by Tom Heller, filed on Nov. 29, 2022, the contents of both of which are herein incorporated by reference.

FIELD

The present disclosure relates to techniques for performing testing of a circuit sub-block with multiple components in an integrated circuit, such as a phase shifter.

BACKGROUND

In order to provide improved safety and more-convenient transportation options, many automotive manufacturers are including additional sensors and/or features in their vehicles. For example, self-driving cars typically include a wide variety of sensors, such as acoustic and/or electromagnetic sensors that monitor the surrounding environment to detect other vehicles, people, animals, or obstacles. Moreover, many vehicles include sensors that monitor the operation of the vehicles (such as parking sensors or seat-adjustment sensors) and, more generally, components that provide features or functionality (such as internal lighting).

In order to ensure safe operation of vehicles, the automotive industry typically include safety features that test functional safety (such as functional safety testing that is compliant with ISO 26262, from the International Organization for Standardization, of Geneva, Switzerland) to detect or flag problems in circuits, such as circuits that use sensors (such as radar sensors) to monitor the surrounding environment of a vehicle. For example, a power detector in a radar transceiver may inject a test electrical signal into a receiver to confirm it is operating correctly.

However, radar transceivers often include complicated circuit sub-blocks that are implemented in the analog domain and the digital domain, and which typically include multiple components. Accurately testing the numerous components in a circuit sub-block on an ongoing basis during operation of a vehicle can be challenging, and the test structures can occupy a large area on a silicon die, which increases the cost of the transceiver.

SUMMARY

Embodiments of an integrated circuit are described. This integrated circuit includes a circuit sub-block that performs a function, where the circuit sub-block is implemented in an analog domain using analog components and in a digital domain using digital components. Moreover, the integrated circuit performs testing of the circuit sub-block using independent testing of individual components in the circuit sub-block instead of testing the function of the circuit sub-block as a whole. Note that the individual components include the analog components and the digital components.

In some embodiments, the circuit sub-block may include a phase shifter and the function may include providing an output signal having a phase shift relative to an input signal, and the input signal and the output signal may be in a non-zero band of frequencies.

Moreover, the testing of the analog components may include testing for a presence of power and may exclude testing of radio-frequency functionality.

Furthermore, the testing of the digital components may include performing measurements on the digital components and a replica of the digital components. For example, the testing of the digital components may include: comparing the measurements on the digital components and the replica of the digital components; and, when the comparison indicates there is a difference between the measurements on the digital components and the replica of the digital components, asserting a flag. In some embodiments, the circuit sub-block may include the phase shifter, the digital component may include a look-up-table (LUT) decoder, the testing of the LUT decoder may include inputting values of the phase shift to the LUT decoder and a replica LUT decoder, and the comparison may be performed by performing an XOR logical operation on measured outputs from the LUT decoder and measured outputs from the replica LUT decoder for the values of the phase shift.

Note that the testing may include functional safety testing.

Moreover, the integrated circuit may assess the circuit sub-block based at least in part on results of the testing and a ratio of detectable potential faults in the given component to a total number of potential faults in the given component.

Furthermore, the analog components may include a variable-gain amplifier, the variable-gain amplifier may include a Gilbert cell, and the testing may include performing measurements at different gain values of the variable-gain amplifier using a replica circuit that includes a second Gilbert cell. During the testing at a given gain value, a differential DC input signal may be applied to the second Gilbert cell and two measurements are performed. For example, the voltage at each of the outputs is measured to find the differential DC output signal.

Alternatively or additionally, the analog components may include the variable-gain amplifier, the variable-gain amplifier may include the Gilbert cell, and the testing may include performing measurements at different gain values of the variable-gain amplifier using a replica circuit that includes a third Gilbert cell in which drain nodes are not cross-coupled. During the testing at a given gain value, a differential DC input signal may not be applied to the third Gilbert cell and a number of measurements equal to a number of drain nodes in the second Gilbert cell may be performed.

In some embodiments, the circuit sub-block may include the phase shifter, the phase shifter may include a variable-gain amplifier, and the testing may include radio-frequency testing for a presence of power of the variable-gain amplifier over a range of gain values of the variable-gain amplifier. Moreover, the phase shifter may include an in-phase input signal and an out-of-phase input signal that is orthogonal to the in-phase input signal, and the testing for the presence of power of the variable-gain amplifier over the range of gain values of the variable-gain amplifier may be for the in-phase input signal and the out-of-phase input signal. Note that the testing for the presence of power of the variable-gain amplifier over the range of gain values of the variable-gain amplifier may include a subset of gain values in the range of gain values. Furthermore, the testing may include confirming an expected difference in power levels at extrema gain values over the range of gain values relative to power levels at an origin in the range of gain values.

Another embodiment provides an electronic device that includes the integrated circuit.

Another embodiment provides a system that includes the integrated circuit.

Another embodiment provides a method for performing testing of the circuit sub-block. This method includes at least some of the operations performed by the integrated circuit.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

An integrated circuit that performs testing of a circuit sub-block is described. This integrated circuit may include the circuit sub-block that performs a function, where the circuit sub-block is implemented in an analog domain using analog components and in a digital domain using digital components. Moreover, the integrated circuit may perform the testing of the circuit sub-block using independent testing of individual components in the circuit sub-block instead of testing the function of the circuit sub-block as a whole. Note that the individual components include the analog components and the digital components. In some embodiments, the testing may include functional safety testing.

By performing independent testing of individual components instead of testing the function of the circuit sub-block as a whole, these circuit techniques may provide more-accurate testing of the circuit sub-blocks. Notably, by covering a sufficient number of sub-components in the circuit sub-block, the circuit techniques may achieve a much higher safety rating than by testing the function of the circuit sub-block as a whole. Moreover, the required silicon area and the design time of the integrated circuit may be reduced. Consequently, the circuit techniques may improve the performance and the reliability of the circuit sub-block.

In the discussion that follows, a vehicle may include: an automobile, a sports utility vehicle, a truck, a motorcycle, a train, an aircraft, a boat, or another type of transportation conveyance. However, in the discussion that follows, an automobile is used as an illustrative example of the vehicle.

Moreover, in the discussion that follows, a vehicle may use one or more types of sensors to perform measurements associated with objects in the surrounding environment. While a wide variety of types of sensors may be used, in the discussion that follows radar sensors are used as an illustrative example. The radar sensors may perform measurements using at least one of a variety of modes of operation (such as pulsed or continuous-wave), and may involve the use of one or more types of modulation (such as amplitude, frequency and/or phase modulation). In the discussion that follows, frequency-modulated continuous-wave (FMCW) radar is used as an illustration. Furthermore, transmitted and received radar signals (e.g., having carrier frequencies in a radar band of frequencies, such as between 3 MHz and 100 GHz) may be generated and/or processed in the analog domain and/or the digital domain.

Figure 1:
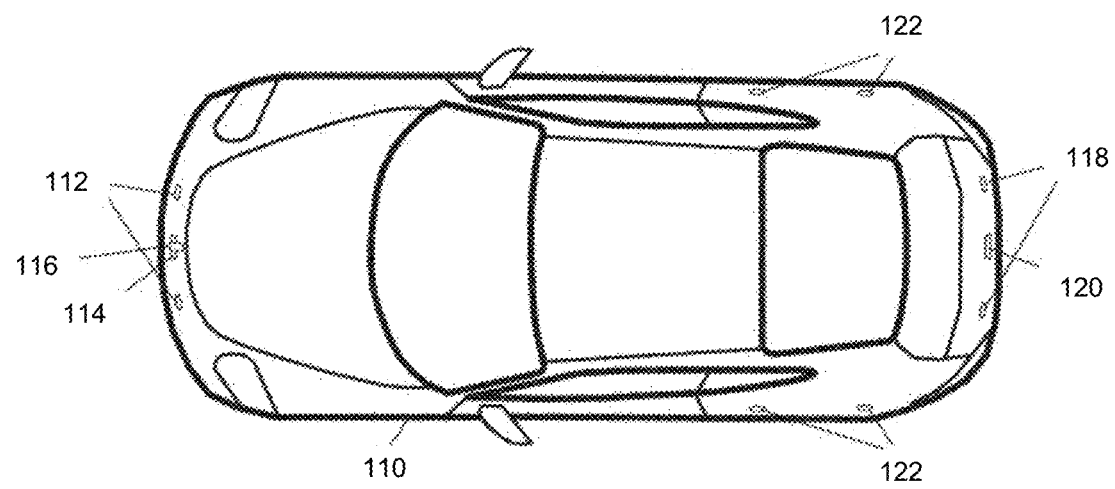
FIG. 1 is a drawing illustrating an example of a vehicle equipped with radar sensors according to some embodiments of the present disclosure.
Figure 2:
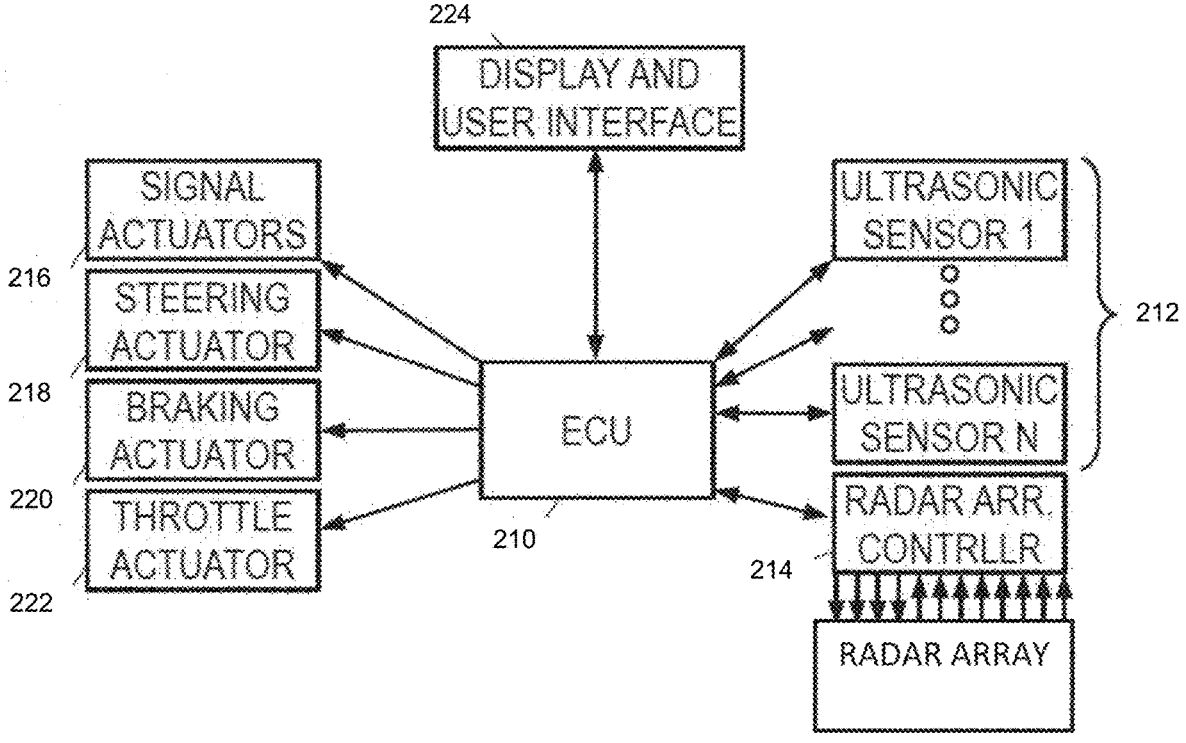
FIG. 2 is a block diagram illustrating an example of a driver-assistance system according to some embodiments of the present disclosure.

We now describe embodiments of the circuit techniques. FIG. 1 presents a drawing illustrating an example of a vehicle 110 equipped with an array of radar antennas, including: antennas 112 for short-range sensing (e.g., for parking assist), antennas 114 for mid-range sensing (e.g., for monitoring stop-and-go traffic and cut-in events), antennas 116 for long-range sensing (e.g., for adaptive cruise control and collision warning), each of which may be placed behind the front bumper cover. Antennas 118 for short-range sensing (e.g., for back-up assist) and antennas 120 for mid-range sensing (e.g., for rear-collision warning) may be placed behind the back-bumper cover. Moreover, antennas 122 for short-range sensing (e.g., for blind-spot monitoring and side-obstacle detection) may be placed behind the car fenders. Each antenna and each set of antennas may be grouped in one or more arrays. Furthermore, each array may be controlled by a radar-array controller 205 (FIG. 2). In some embodiments, a given set of antennas may perform multiple-input multiple-output (MIMO) radar sensing. The type, number, and configuration of sensors in the sensor arrangement for vehicles having driver-assist and self-driving features varies. The vehicle may employ the sensor arrangement for detecting and measuring distances/directions to objects in the various detection zones to enable the vehicle to navigate while avoiding other vehicles and obstacles. While the preceding discussion illustrates vehicle 110 with radar sensors, in other embodiments vehicle 110 may include additional types of sensors, such as LiDAR, an ultrasonic sensor, a camera, etc.

FIG. 2 presents a block diagram illustrating an example of a driver-assistance system. This driver assistance system may include an electronic control unit (ECU) 210 coupled to various sensors 212 and radar-array controller 214 as the center of a star topology. However, other topologies may include serial, parallel, and hierarchical (tree) topologies. Radar-array controller 214 may couple to the transmit and receive antennas (e.g., in antennas 114) to transmit electromagnetic waves, receive reflections, and determine a spatial relationship of the vehicle to its surroundings. Moreover, radar-array controller 214 may couple to carrier-signal generators. In some embodiments, radar-array controller 214 may control the timing and order of actuation of a plurality of carrier signal generators.

In order to provide automated parking assistance, ECU 210 may couple to a set of actuators, such as: a turn-signal actuator 216, a steering actuator 218, a braking actuator 220 and/or a throttle actuator 222. Moreover, ECU 210 may couple to an interactive user interface 224 to accept user input and to display various measurements and system status.

Using user interface 224, sensors, and actuators, ECU 210 may provide: automated parking, assisted parking, lane-change assistance, obstacle and blind-spot detection, autonomous driving and/or other desirable features. During operation of vehicle 110 (FIG. 1), sensor measurements may be acquired by ECU 210, and may be used by ECU 210 to determine a status of vehicle 110. Moreover, ECU 210 may act on the status and incoming information to actuate signaling and control transducers to adjust and maintain operation of vehicle 110. For example, the operations that may be provided by ECU 210 include driver-assist features, such as: automatic parking, lane following, automatic braking, self-driving, etc.

Furthermore, in order to obtain the measurements, ECU 210 may employ a MIMO radar system. Radar systems operate by emitting electromagnetic waves that travel outward from a transmit antenna before being reflected towards a receive antenna. The reflector may be any moderately reflective object in the path of the emitted electromagnetic waves. By measuring the travel time of the electromagnetic waves from the transmit antenna to the reflector and back to the receive antenna, the radar system may determine the distance to the reflector. Additionally, by measuring a Doppler shift of the electromagnetic waves, the radar system may determine a velocity of the reflector relative to vehicle 110 (FIG. 1). When multiple transmit or receive antennas are used, or when multiple measurements are made at different positions, the radar system may determine the direction to the reflector and, thus, may track the location of the reflector relative to vehicle 110 (FIG. 1). With more sophisticated processing, multiple reflectors may be tracked. In some embodiments, the radar system may employ array processing to 'scan' a directional beam of electromagnetic waves and to construct an image of the surroundings of environment around vehicle 110 (FIG. 1). In general, pulsed and/or continuous-wave implementations of the radar system may be implemented.

Figure 3:
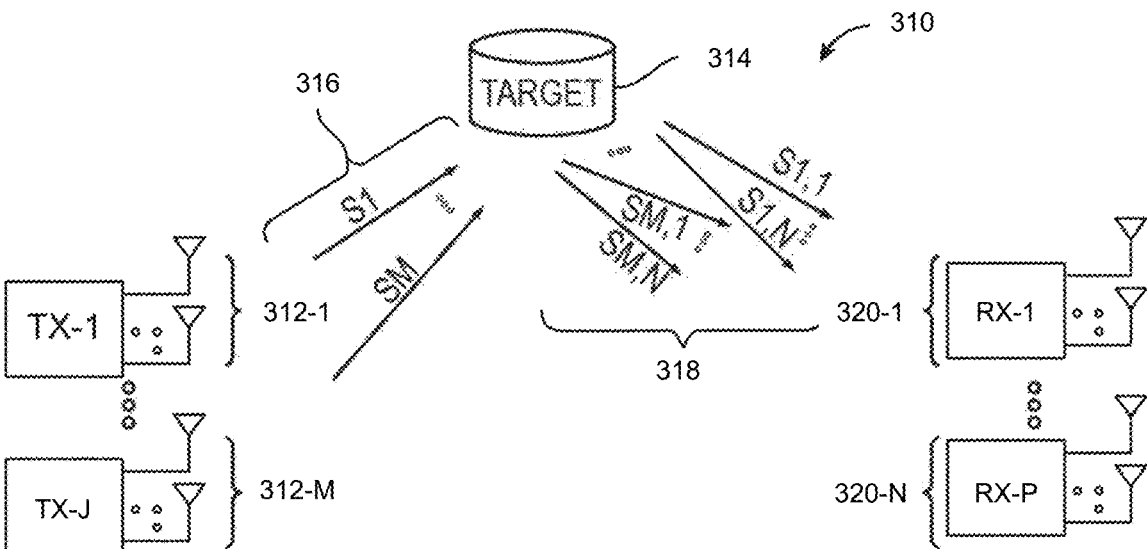
FIG. 3 is a block diagram illustrating an example of a radar system according to some embodiments of the present disclosure.

FIG. 3 presents a block diagram illustrating an example of a radar system 310 having a MIMO configuration, in which J transmitters are collectively coupled to M transmit antennas 312 to send transmit signals 316, where J and M are non-zero integers. The M possible transmit signals 316 may reflect from one or more reflectors or targets 314 to be received as receive signals 318 via N receive antennas 320 coupled to P receivers, where N and P are non-zero integers. Each receiver may extract the amplitude and phase or travel delay associated with each of the M transmit signals 316, thereby enabling the system to obtain N·M measurements (though only J·P of the measurements may be obtained concurrently). The processing requirements associated with each receiver extracting J measurements can be reduced via the use of time-division multiplexing and/or orthogonal coding. Moreover, the available antennas may be systematically multiplexed to the available transmitters and receivers to collect the full set of measurements for radar imaging.

Figure 4:
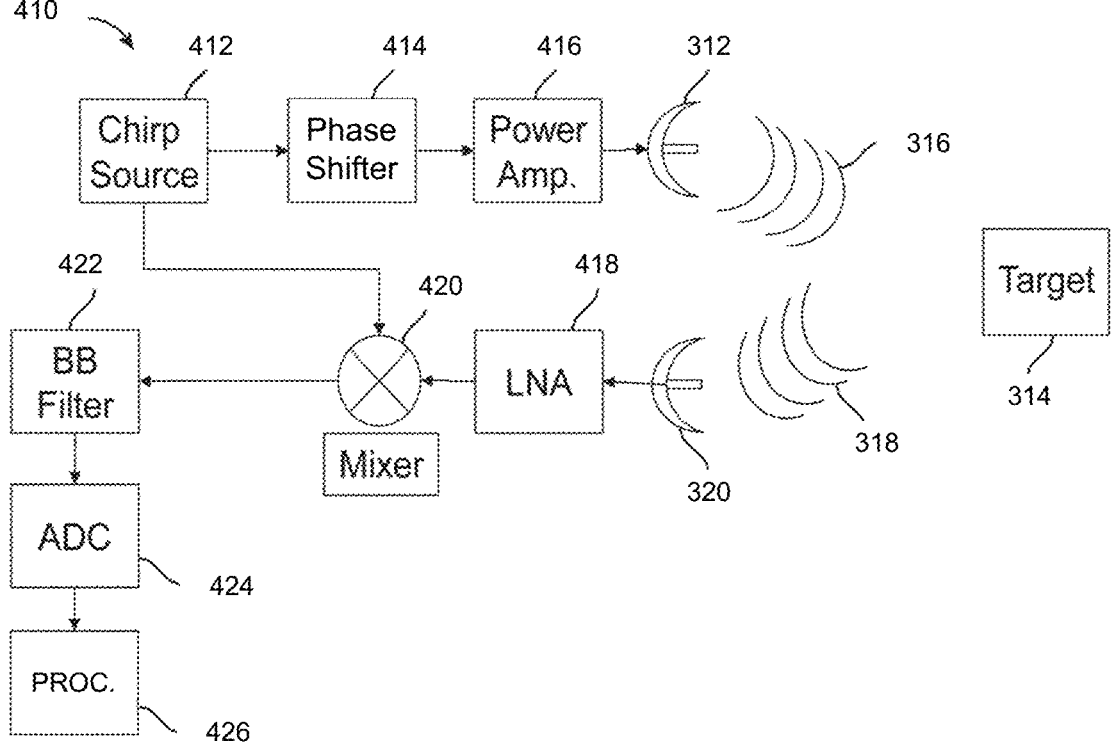
FIG. 4 is a block diagram illustrating an example of a radar system according to some embodiments of the present disclosure.

FIG. 4 presents a block diagram illustrating an example of a radar transceiver circuit 410 (e.g., in radar system 310 in FIG. 3). In some embodiments, radar transceiver circuit 410 is implemented as an integrated circuit in a packaged chip. Radar transceiver circuit 410 may include: a carrier-signal (chirp) generator 412, a phase shifter 414, an amplifier 416, and/or transmit antennas 312 which can transmit signals 316 based at least in part on the output of the carrier-signal generator 412. Moreover, radar transceiver circuit 410 may include: receiver antennas 320, a low-noise amplifier (LNA) 418, and/or a mixer 420. Mixer 420 may mix received signals 318 detected by receive antennas 312 with the signal from the carrier-signal generator 412. Furthermore, low-noise amplifier 418 may be used to amplify received signals 318 detected by receive antennas 320. In some embodiments, radar transceiver circuit 410 may include: a sensitivity time controller and equalizer (not shown), a broadband (BB) filter 422, an analog-to-digital converter (ADC) 424 and/or a processor 426 (e.g., ECU 210 and/or radar-array controller 214 in FIG. 2), which may perform further processing of the received signals (such as a Fourier transform). In some embodiments, processor 426 and low-noise amplifier 418 may be coupled for bi-directional communication.

Additionally, in some embodiments, carrier-signal generator 412 may be coupled to radar array-controller 214 (FIG. 2). Carrier-signal generator 412 may include a chirp generator to create an FMCW signal. The chip rate of carrier-signal generator 412 may be controlled by radar-array controller 214 (FIG. 2). In some embodiments, carrier-signal generator 412 may be deactivated by radar-array controller 214 (FIG. 2) to provide an unmodulated carrier signal. Moreover, carrier-signal generator 412 may be implemented as a local oscillation (LO) signal generator, a fractional-N phase lock loop (PLL) with a $\Sigma\Delta$ controller, or as a direct-digital synthesis generator.

Furthermore, carrier-signal generator 412 may be coupled to transmit antennas 312 through phase shifter 414 and amplifier 416. Carrier-signal generator 412 may be coupled to receiving antennas 312 through mixer 420 and low-noise amplifier 418. Additionally, carrier-signal generator 412 may generate a transmit signal (e.g., a chirp signal). Amplifier 416 may receive the transmit signal from carrier-signal generator 412 and transmit signals 316 corresponding to the transmit signal from carrier-signal generator 412 may be transmitted using transmit antennas 312.

In some embodiments, a radar transmitter may include: a phase rotator, a bi-phase modulator, a variable gain amplifier, a switch, a power amplifier driver, a power amplifier, and/or a digital signal processor (DSP). Moreover, in some embodiments, a radar transmitter may include a digital controller. This digital controller may be included in the DSP or may be a separate component. Furthermore, the phase rotator may be used for digital phase modulation. Additionally, the radar transmitter may use a wave-modulated power amplifier in a digital-envelope modulation technique.

As noted previously, it can be difficult to accurately test circuits that are used in vehicles on an ongoing basis during operation of the vehicles. For example, a phase-array circuit in a transceiver may include a phase-shifter sub-block (which is sometimes referred to as a 'phase shifter'). Notably, a 6-bit phase shifter may be used in a phased array to provide 64 phase states. The phase shifter may split an input signal into quadrature or orthogonal components I and Q, which are amplified or attenuated based at least in part on weights, and then are combined into a weighted output to a obtain a different phase relative to the input signal. A safety testing circuit for a phase shifter may include an I/Q-downconverter-mixer-based mm-wave phase detector whose radio frequency and local oscillator inputs are coupled to power-amplifier input signals from two adjacent transmitters. However, this phase detector may occupy a large silicon area and may be hard to implement. For example, the phase detector may exhibit poor integral non-linearity (INL) because of strong radio-frequency leakage from the transmitters, which typically cannot be fully eliminated by calibration or by disabling the power amplifiers.

In the disclosed circuit techniques, these problems may be addressed by independently assessing the functionality of the individual components in the phase shifter, instead of assessing the phase-shifter functionality via direct phase measurement (e.g., at 80 GHz). Notably, the functionality of the individual components in the phase shifter may be assessed using $$coverage = \frac{number\ of\ detectable\ potential\ faults}{number\ of\ potential\ faults}.$$

By covering a sufficient number of sub-components in the phase shifter, the circuit techniques may achieve a much higher safety rating than by a using a mm-wave phase detector. For example, the disclosed circuit techniques may provide a safety coverage of 98% in the phase shifter. Furthermore, the required silicon area may be negligible, and the design time may be significantly shorter than that needed for the phase detector.

The disclosed circuit techniques may be used to perform testing of a variety of circuits and circuit sub-blocks in an integrated circuit. For example, the circuit techniques may be used to perform testing of an active Cartesian phase shifter with Gilbert cell-based variable gain amplifiers. However, in some embodiments, the disclosed circuit techniques may be adapted to other Cartesian phase shifters.

Figure 5:
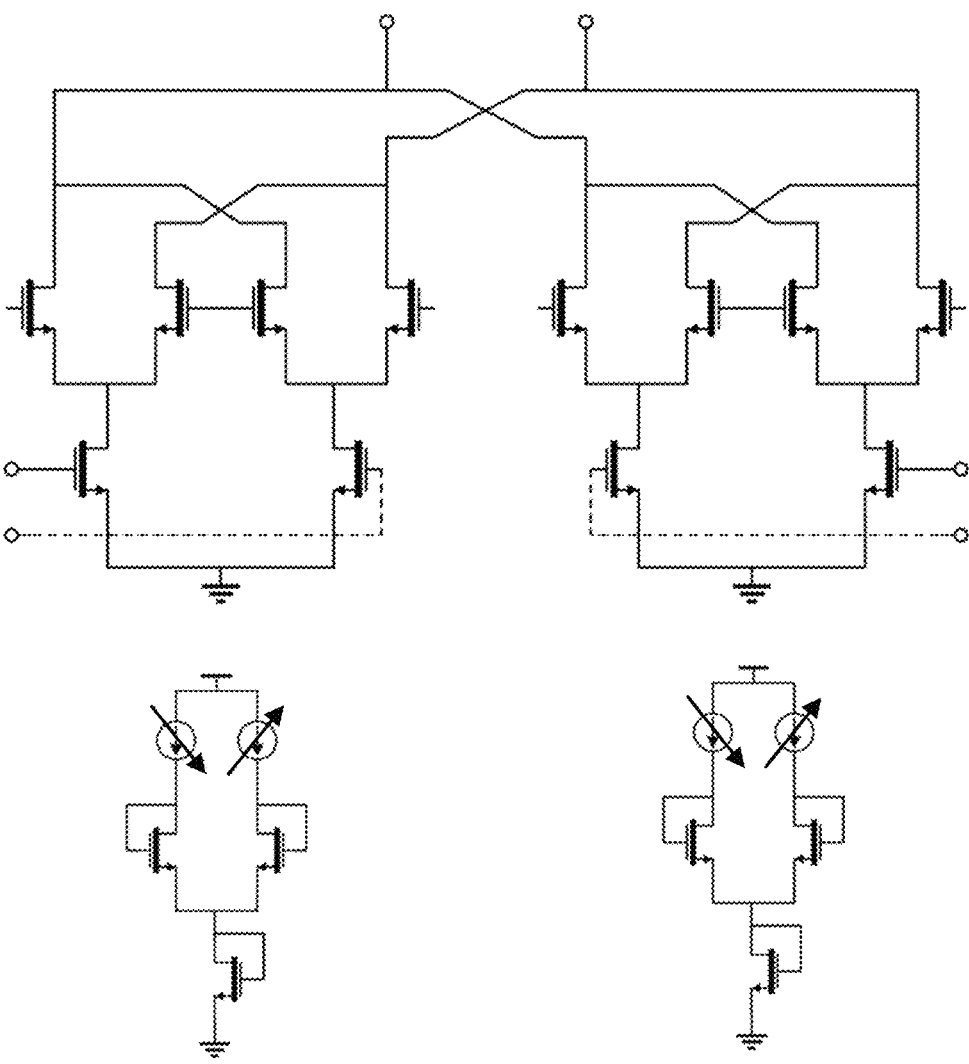
FIG. 5 is a block diagram illustrating an example of a phase-shifter sub-block according to some embodiments of the present disclosure.

FIG. 5 presents a block diagram illustrating an example of a phase-shifter sub-block. Notably, the phase shifter may include: radio-frequency sub-blocks (such as a passive quadrature hybrid and an input matching network, a Gilbert cell-based I and Q variable-gain amplifiers (VGAs), and/or a current-combining output matching network); digital sub-blocks (such as a hard-coded 6 bit-to-12 bit LUT that translates an input phase setting to I and Q gain settings); and/or analog sub-blocks (such as I and Q pseudo-differential current digital-to-analog converters or IDACs that are controlled by the LUT, a differential diode-connected FETs that convert the IDAC differential currents to differential common-gate or CG bias voltages $$V_I^+, V_I^-, V_Q^+, V_Q^-,$$

and/or a common-source or CS bias circuit).

Figure 6:
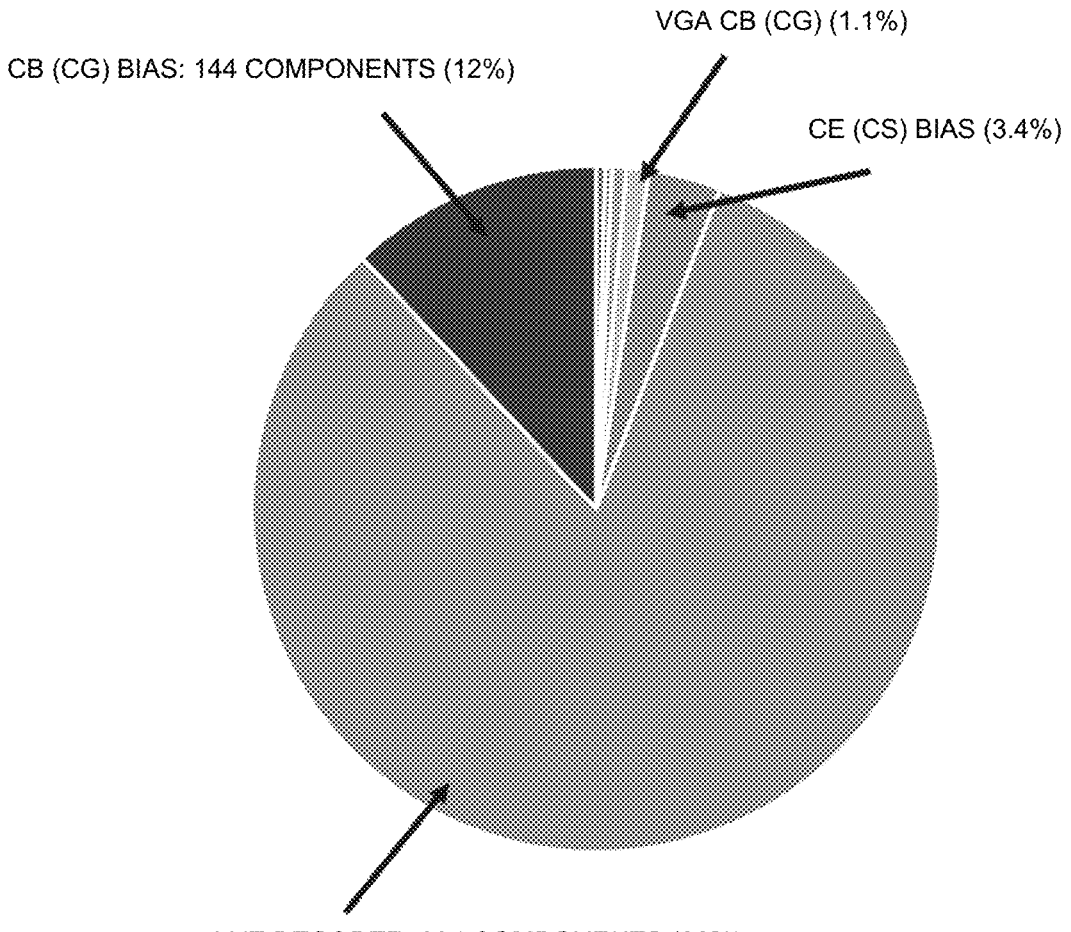
FIG. 6 is a drawing illustrating an example of component count per circuit sub-block in a Cartesian phase shifter according to some embodiments of the present disclosure.

FIG. 6 presents a drawing illustrating an example of component count per circuit sub-block in a Cartesian phase shifter. Notably, the common-base (CB) or common-gate bias may include 12% (or 144 components) of the components in the circuit sub-block, the components in the common-base or common-gate bias for the variable-gain amplifiers may include 1.1% of the components in the circuit sub-block, the components in the common-emitter (CE) or common-source bias may include 3.4% of the components in the circuit sub-block, and a LUT decoder may include 82% (or 944 components) of the components in the circuit sub-block. Thus, in the Cartesian phase shifter, the highest probability of failure is for the digital sub-block, which includes the LUT decoder. (Note that the LUT decoder may include 64 rows with values of gain for different values of I and Q. Because of the differential signals, the phase of the signals to Gilbert cell-based variable gain amplifiers in a Cartesian phase shifter may be inverted by changing the polarity of the local-oscillator signal.)

In the circuit techniques, note that failure may be detected using mostly low-frequency measurements. High-frequency measurements may perform basic power detection (such as no leakage, etc.).

Figure 7:
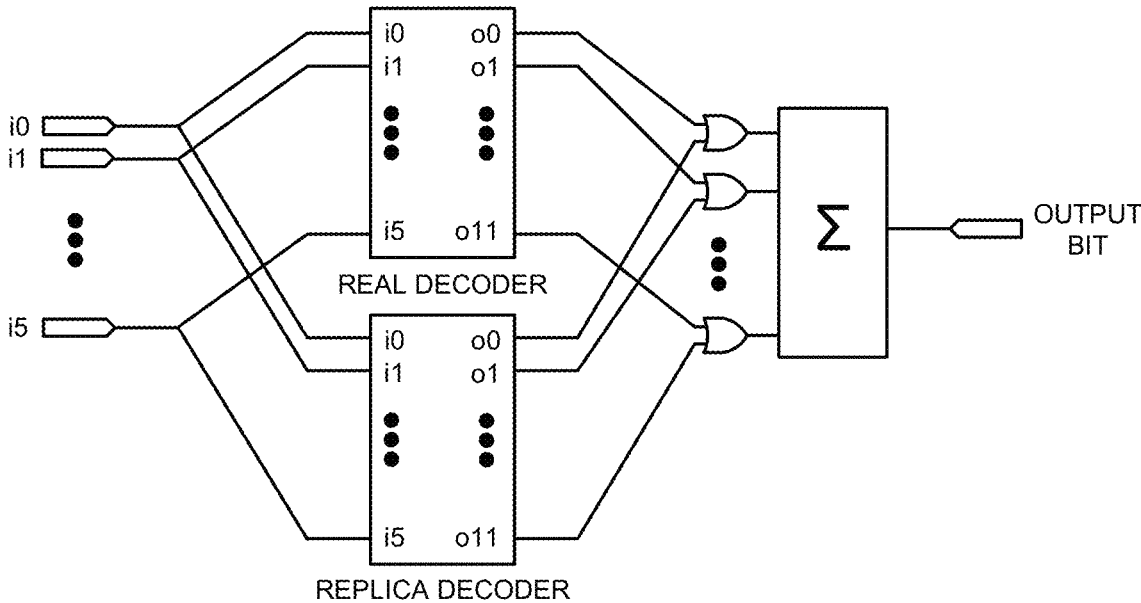
FIG. 7 is a drawing illustrating an example of look-up table (LUT) decoder coverage according to some embodiments of the present disclosure.

FIG. 7 presents a drawing illustrating an example of LUT decoder coverage. The input to the LUT decoder may be an N-bit word (where N is an integer) that represents the $2^N$ phase-shifter states (or the phase value of the output signal from the phase shifter), and its output may be two N-bit words that represent the I and Q variable-gain-amplifier gain settings. In some embodiments, an identical replica of the LUT decoder may be used to perform bit-wise comparisons of the output bits of the real and replica LUT decoders. For example, during the testing, for each $2^N$ phase-shifter setting inputs: read the 2 N output bits of the real LUT decoder and the replica LUT decoder; perform a bit-wise comparison (e.g., using an XOR operation and, more generally, detecting whether there is a different in the output of the real LUT decoder and the replica LUT decoder) and sum the results; raise a flag when the result is greater than zero. Note that any failure would have to appear in the exact same place in the replica LUT decoder in order to avoid detection.

Figure 8:
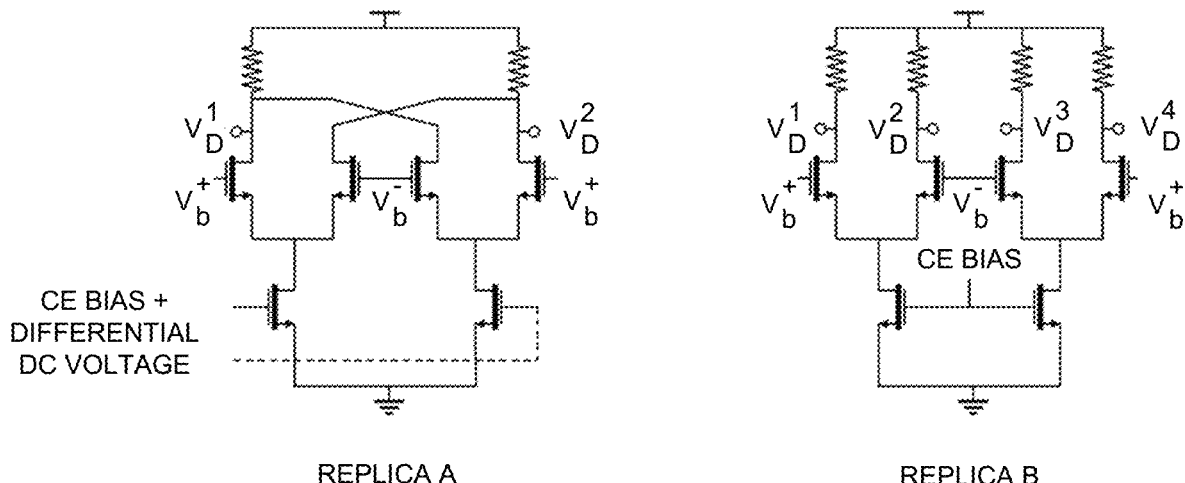
FIG. 8 is a drawing illustrating an example of analog sub-block coverage according to some embodiments of the present disclosure.

FIG. 8 presents a drawing illustrating an example of analog sub-block coverage. The analog sub-block includes two bias circuits with a current mirror producing voltage drops on diodes or resistors. Moreover, the analog sub-block may bias the common gate of a Gilbert cell with a DC local oscillator signal on the inputs. (Note that in a Gilbert cell each common-source device sets the predefined total current of the two common-gate devices above it. The differential common-gate bias voltage sets the differential current through the common-gate devices. Consequently, the analog sub-block may bias the differential common-gate devices of a Gilbert cell.) Thus, the analog sub-block adjusts the gain of the Gilbert cell, thereby providing a variable-gain amplifier. In the analog sub-block, when the current $I^+$ is high and the current $I^-$ is low, the analog sub-block is a differential cascode stage. Alternatively, when the current $I^+$ is low and the current $I^-$ is high, the analog sub-block inverts the phase. Furthermore, when $I^+$ equals $I^-$, the analog sub-block provides complete cancellation. Therefore, the local oscillator input signal and the differential voltage in the analog sub-block may provide gain and/or phase inversion.

During the testing the analog sub-block, the variable-gain amplifier common-gate differential bias voltage may be applied to a DC replica of the variable-gain amplifier, which in turn may be converted to output voltages. In some embodiments, the testing may use one or more types of replicas. For example, replica A may include a Gilbert cell with two load resistors (instead of using input/output matching networks), while in replica B the four drain nodes may not be cross-coupled and there are four outputs.

Moreover, during the testing, the DC gain may be measured (e.g., using an analog-to-digital converter). For example, a given measurement may sample the I/Q amplitudes just before the radio-frequency conversion in a radar transceiver. Note that for replica A two voltage measurements may be needed per bias setting, but replica A may require a differential DC input signal. Furthermore, in replica B, because the four drain nodes may not be cross-coupled, no differential DC input signal may be needed. However, four voltage measurements may be needed for each bias setting $$(V_D^1, V_D^2, V_D^3, V_D^4).$$

For replica A, note that when the gate voltages are equal, the outputs may be the same. Alternatively, for replica B, note that when the gate voltages are equal, there may be a difference between two outputs.

Additionally, note that it may not be necessary to test all $2^N$ states for each variable-gain amplifier. The number of required states may be on the order of N per variable-gain amplifier (where N is a non-zero integer), because each IDAC may include N elements. Similarly, the common-source bias voltage may be tested by generating a DC current via a current mirror and converting it to voltage on a resistor. However, as described further below, the radio-frequency measurement may make this test redundant.

Figure 9:
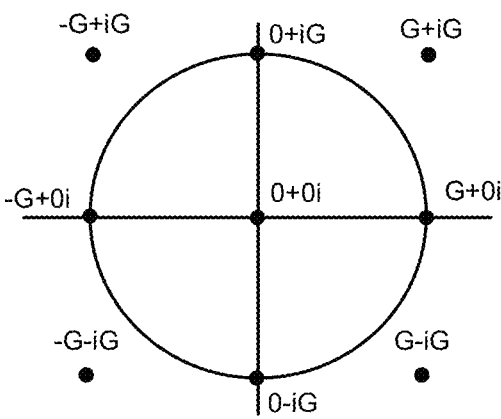
FIG. 9 is a drawing illustrating an example of input phases to a phase-shifter sub-block according to some embodiments of the present disclosure.

In some embodiments, for radio-frequency sub-block coverage, a transmit power detector may be used to infer information about the variable-gain-amplifier gain. Because the amplitude of vector-summed signals is a function of the input phases (e.g., constructive/destructive interference), information about the quadrature hybrid and current combiner may be inferred. Notably, during these measurements: lower the transmit gain (via the variable-gain-amplifier and power-amplifier bias) to avoid compression (e.g., a minimum gain may be used, so that little or no output power is expected); then, sweep the I and Q variable-gain-amplifier gain over the values {−G, 0, +G}, where G is the maximum variable-gain-amplifier gain, and read the power-detector output (as shown in FIG. 9, which presents a drawing illustrating an example of input phases to a phase-shifter sub-block, this may include a total of nine measurements); confirm that the ±G±iG power levels are equal or approximately equal (e.g., within a tolerance of 1, 3, 5 or 10%); confirm that the ±G±i0 power levels are equal or approximately equal (e.g., within a tolerance of 1, 3, 5 or 10%) and are, e.g., 3 dB lower than the power levels at ±G±iG (e.g., within a tolerance of 1, 3, 5 or 10%); and confirm that the 0±i0 power level is much lower than the other measured power levels. In some embodiments, the testing may use more variable-gain-amplifier gain values or may use continuous variable-gain-amplifier gain values over the ranges shown in FIG. 9. In general, the variable-gain-amplifier gain values may be based at least in part on a resolution and a dynamic range of the transmit power detector. While the aforementioned measurements may not be sufficiently accurate to cover aging-related mismatch, they may be able to detect hard-component faults (such as opens and shorts). Furthermore, note, once again, that radio-frequency components in the phase-shifter sub-block may only constitute approximately 1% of the total component count.

Figure 10:
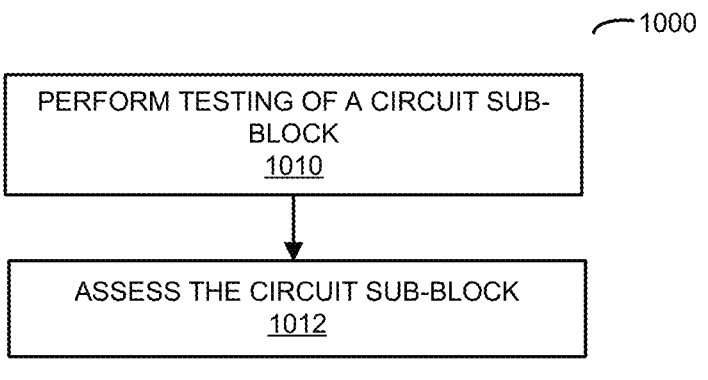
FIG. 10 is a flow diagram illustrating an example of a method for performing testing of a circuit sub-block according to some embodiments of the present disclosure.

We now describe embodiments of a method. FIG. 10 presents a flow diagram illustrating an example of a method 1000 for performing testing of a circuit sub-block, which may be performed by an integrated circuit. During operation, the integrated circuit may perform testing of the circuit sub-block (operation 1010) using independent testing of individual components in the circuit sub-block instead of testing the function of the circuit sub-block as a whole, where the circuit sub-block performs a function and is implemented in an analog domain using analog components and in a digital domain using digital components, and the individual components include the analog components and the digital components. Then, the integrated circuit may assess the circuit sub-block (operation 1012) based at least in part on results of the testing and a ratio of detectable potential faults in the given component to a total number of potential faults in the given component. For example, the assessment may include whether (or not) the circuit sub-block is able to perform the function. Note that the testing may include functional safety testing.

In some embodiments of the method 1000, there may be additional or fewer operations. Moreover, the order of the operations may be changed, and/or two or more operations may be combined into a single operation.

The disclosed integrated circuit and the circuit techniques can be (or can be included in) any electronic device or system. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the integrated circuit and/or the integrated circuit that includes the integrated circuit, in alternative embodiments different components and/or subsystems may be present in the integrated circuit and/or the integrated circuit that includes the integrated circuit. Thus, the embodiments of the integrated circuit and/or the integrated circuit that includes the integrated circuit may include fewer components, additional components, different components, two or more components may be combined into a single component, a single component may be separated into two or more components, one or more positions of one or more components may be changed, and/or there may be different types of components.

Moreover, the circuits and components in the embodiments of the integrated circuit and/or the integrated circuit that includes the integrated circuit may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
a circuit sub-block configured to perform a function, wherein the circuit sub-block is implemented in an analog domain using analog components and in a digital domain using digital components;
wherein the integrated circuit is configured to perform testing of the circuit sub-block using independent testing of individual components in the circuit sub-block instead of testing the function of the circuit sub-block as a whole;
wherein the individual components comprise the analog components and the digital components;

wherein the circuit sub-block comprises a phase shifter and the function comprises providing an output signal having a phase shift relative to an input signal; and
wherein the phase shifter comprises a variable-gain amplifier and the testing comprises radio-frequency testing for a presence of power of the variable-gain amplifier over a range of gain values of the variable-gain amplifier.

2. The integrated circuit of claim 1, wherein the circuit sub-block comprises a phase shifter and the function comprises providing an output signal having a phase shift relative to an input signal, and the input signal and the output signal are in a non-zero band of frequencies.

3. The integrated circuit of claim 1, wherein the testing of the analog components comprises testing for a presence of power and excludes testing of radio-frequency functionality.

4. The integrated circuit of claim 1, wherein the testing of the digital components comprises performing measurements on the digital components and a replica of the digital components.

5. The integrated circuit of claim 4, wherein the testing of the digital components comprises:
comparing the measurements on the digital components and the replica of the digital components; and
when the comparison indicates there is a difference between the measurements on the digital components and the replica of the digital components, asserting a flag.

6. The integrated circuit of claim 5, wherein the circuit sub-block comprises a phase shifter and the function comprises providing an output signal having a phase shift relative to an input signal;
wherein the digital component comprises a look-up-table (LUT) detector, the testing of the LUT decoder comprises inputting values of the phase shift to the LUT decoder and a replica LUT decoder, and the comparison is performed by performing an XOR logical operation on measured outputs from the LUT decoder and measured outputs from the replica LUT decoder for the values of the phase shift.

7. The integrated circuit of claim 1, wherein the integrated circuit is configured to assess the circuit sub-block based at least in part on results of the testing and a ratio of detectable potential faults in a given component in the circuit sub-block to a total number of potential faults in the given component.

8. The integrated circuit of claim 1, wherein the analog components comprise a variable-gain amplifier and the variable-gain amplifier comprises a Gilbert cell;
wherein the testing comprises performing measurements at different gain values of the variable-gain amplifier using a replica circuit that comprises a second Gilbert cell; and
wherein, during the testing at a given gain value, a differential DC input signal is applied to the second Gilbert cell and two measurements are performed.

9. The integrated circuit of claim 1, wherein the analog components comprise a variable-gain amplifier and the variable-gain amplifier comprises a Gilbert cell;
wherein the testing comprises performing measurements at different gain values of the variable-gain amplifier using a replica circuit that comprises a second Gilbert cell in which drain nodes are not cross-coupled; and
wherein, during the testing at a given gain value, a differential DC input signal is not applied to the second Gilbert cell and a number of measurements equal to a number of drain nodes in the second Gilbert cell are performed.

10. The integrated circuit of claim 1, wherein the phase shifter comprises an in-phase input signal and an out-of-phase input signal that is orthogonal to the in-phase input signal; and wherein the testing for the presence of power of the variable-gain amplifier over the range of gain values of the variable-gain amplifier is for the in-phase input signal and the out-of-phase input signal.

11. The integrated circuit of claim 10, wherein the testing for the presence of power of the variable-gain amplifier over the range of gain values of the variable-gain amplifier comprises a subset of gain values in the range of gain values.

12. The integrated circuit of claim 11, wherein the testing comprises confirming an expected difference in power levels at extrema gain values over the range of gain values relative to power levels at an origin in the range of gain values.

13. An electronic device, comprising:

an integrated circuit, wherein the integrated circuit comprises:

a circuit sub-block configured to perform a function, wherein the circuit sub-block is implemented in an analog domain using analog components and in a digital domain using digital components;

wherein the integrated circuit is configured to perform testing of the circuit sub-block using independent testing of individual components in the circuit sub-block instead of testing the function of the circuit sub-block as a whole;

wherein the individual components comprise the analog components and the digital components;

wherein the circuit sub-block comprises a phase shifter and the function comprises providing an output signal having a phase shift relative to an input signal; and wherein the phase shifter comprises a variable-gain amplifier and the testing comprises radio-frequency testing for a presence of power of the variable-gain amplifier over a range of gain values of the variable-gain amplifier.

14. The electronic device of claim 13, wherein the electronic device comprises a vehicle.

15. A method for performing testing of a circuit sub-block, comprising:

by an integrated circuit:

performing testing of a circuit sub-block in the integrated circuit using independent testing of individual components in the circuit sub-block instead of testing the function of the circuit sub-block as a whole, wherein the circuit sub-block performs a function and is implemented in an analog domain using analog components and in a digital domain using digital components; and wherein the individual components comprise the analog components and the digital components; and assessing the circuit sub-block based at least in part on results of the testing and a ratio of detectable potential faults in a given component in the circuit sub-block to a total number of potential faults in the given component, wherein the circuit sub-block comprises a phase shifter and the function comprises providing an output signal having a phase shift relative to an input signal; and wherein the phase shifter comprises a variable-gain amplifier and the testing comprises radio-frequency testing for a presence of power of the variable-gain amplifier over a range of gain values of the variable-gain amplifier.

16. The method of claim 15, wherein the circuit sub-block comprises a phase shifter and the function comprises providing an output signal having a phase shift relative to an input signal, and the input signal and the output signal are in a non-zero band of frequencies.

17. The method of claim 15, wherein the testing of the analog components comprises testing for a presence of power and excludes testing of radio-frequency functionality.

18. The method of claim 15, wherein the testing of the digital components comprises performing measurements on the digital components and a replica of the digital components.

19. The method of claim 15, wherein the testing comprises functional safety testing.

20. The method of claim 15, wherein the integrated circuit is included in a vehicle.

\* \* \* \* \*